United States Patent
Seningen et al.

(10) Patent No.: US 8,559,249 B1
(45) Date of Patent: Oct. 15, 2013

(54) MEMORY WITH REDUNDANT SENSE AMPLIFIER

(75) Inventors: Michael R. Seningen, Austin, TX (US); Michael E. Runas, McKinney, TX (US)

(73) Assignee: Apple Inc., Cupertino, CA (US)

( * ) Notice: Subject to any disclaimer, the term of this patent is extended or adjusted under 35 U.S.C. 154(b) by 1 day.

(21) Appl. No.: 13/431,424

(22) Filed: Mar. 27, 2012

(51) Int. Cl.
*G11C 7/22* (2006.01)
*G11C 7/00* (2006.01)
*G11C 7/02* (2006.01)

(52) U.S. Cl.
USPC ............ 365/189.15; 365/201; 365/208

(58) Field of Classification Search
USPC .................................................. 365/189.15
See application file for complete search history.

(56) References Cited

U.S. PATENT DOCUMENTS

| | | | |
|---|---|---|---|
| 5,068,830 A | 11/1991 | Plants | |
| 6,169,696 B1 * | 1/2001 | Bissey | 365/201 |
| 6,363,001 B1 | 3/2002 | Borot | |
| 6,885,600 B2 | 4/2005 | Tran | |
| 7,313,041 B1 * | 12/2007 | Chapman et al. | 365/207 |
| 7,642,620 B2 | 1/2010 | Tanaka | |
| 7,872,929 B2 * | 1/2011 | Dell et al. | 365/200 |
| 2003/0107920 A1 | 6/2003 | Roohparvar | |
| 2009/0021996 A1 | 1/2009 | Versen et al. | |
| 2009/0323446 A1 | 12/2009 | Zhang et al. | |

OTHER PUBLICATIONS

Invitation to Pay Additional Fees in Application No. PCT/US2013/033648, Jul. 3, 2013, pp. 1-5.

* cited by examiner

*Primary Examiner* — Son Mai
(74) *Attorney, Agent, or Firm* — Meyertons, Hood, Kivlin, Kowert & Goetzel, P.C.

(57) ABSTRACT

Embodiments of a memory are disclosed that may reduce the likelihood of a miss-read while reading a weak data storage cell. The memory may include a number of data storage cells, a column multiplexer, a first sense amplifier and a second sense amplifier, and an output circuit. The gain level of the first sense amplifier may be higher than the gain level of the second sense amplifier. The output circuit may include a multiplexer and the multiplexer may be operable to controllably select one of the outputs of the first and second sense amplifiers and pass the value of the selected sense amplifier. The output circuit may include a node that couples the outputs of the first and second sense amplifiers and the outputs of the first and second sense amplifiers may be able to be set to a high impedance state.

20 Claims, 9 Drawing Sheets

MEMORY WITH REDUNDANT SENSE AMPLIFIER

BACKGROUND

1. Technical Field

This invention is related to the field of memory implementation, and more particularly to sensing techniques.

2. Description of the Related Art

Memories typically include a number of data storage cells composed of interconnected transistors fabricated on a semiconductor substrate. Such data storage cells may be constructed according to a number of different circuit design styles. For example, the data storage cells may be implemented as a single transistor coupled to a capacitor to form a dynamic storage cell. Alternatively, cross-couple inverters may be employed to form a static storage cell, or a floating gate MOSFET may be used to create a non-volatile storage cell.

During the semiconductor manufacturing process, variations in lithography, transistor dopant levels, etc., may result in different electrical characteristics between storage cells that are intended to have identical characteristics. Additional variation in electrical characteristics may occur due to aging effects within the transistors as the device is repeatedly operated. These differences in electrical characteristics between transistors can result in data storage cells that output different small signal voltages for the same stored data.

In some cases, the variation of a given data storage cell may result in an output voltage that cannot be properly amplified by the sense amplifier. Such data storage cells may be identified as hard failures during initial testing which may require replacement with redundant data storage cells in order to achieve manufacturing yield goals.

SUMMARY

Various embodiments of a memory circuit are disclosed. In an embodiment, the memory circuit may include data storage cells, a column multiplexer, a first sense amplifier with a first gain level, a second sense amplifier with a second gain level, and an output circuit. In some embodiments, the second gain level may be higher than the first gain level.

In some embodiments, the output circuit may include a multiplexer and the multiplexer may be operable to controllably select the output of the first sense amplifier or the output of the second sense amplifier. In other embodiments, the first sense amplifier and the second sense amplifier may be configured such that their respective outputs may enter a high impedance state, and the output circuit may include a node that couples the output of the first sense amplifier to the output of the second sense amplifier.

During operation, test data may be stored in a data storage cell. The data may be read from the data storage cell using the first sense amplifier and compared to the original test data. The data may be read from the data storage cell using a second sense amplifier and compared to the original test data. The result of these comparisons may be used to determine the strength of the data storage cell. Information indicative of the strength of the data storage cell may be stored.

During subsequent accesses of the data storage cell, the stored cell strength information for the data storage cell may be checked. If the stored cell strength information for the data storage cell indicates that the storage cell is weak, the data may be read from the data storage cell using the second sense amplifier.

BRIEF DESCRIPTION OF THE DRAWINGS

The following detailed description makes reference to the accompanying drawings, which are now briefly described.

Figure 1:
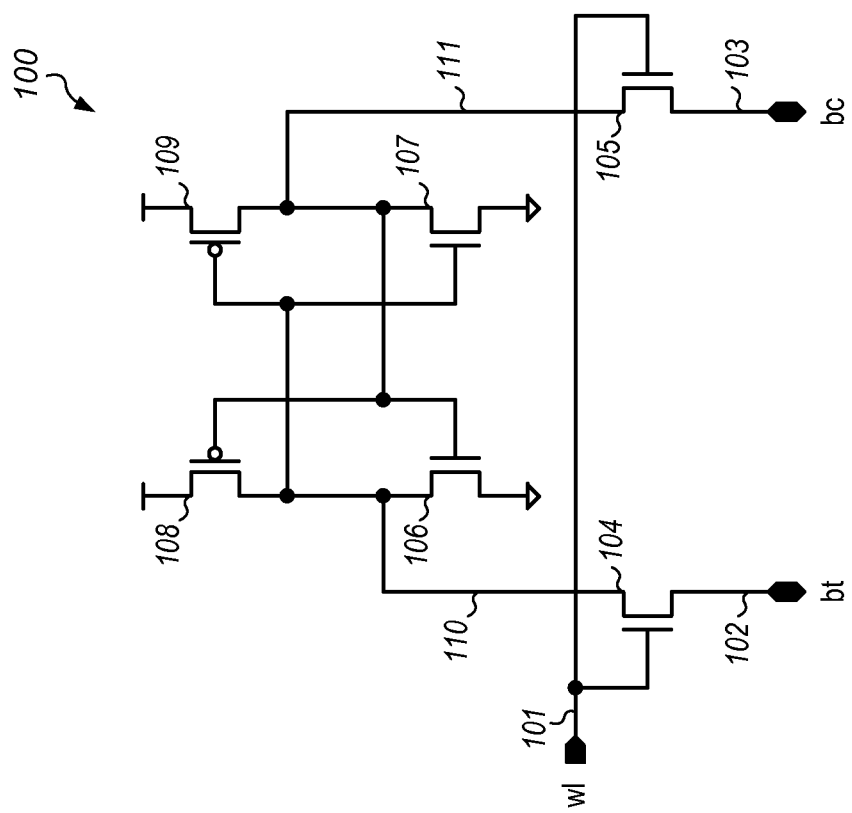
FIG. 1 illustrates an embodiment of a data storage cell.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

During the manufacture of a semiconductor memory circuit, differences in lithography, implant levels, etc., may result in differences in electrical characteristics between data storage cells that are otherwise intended to be identical in characteristics and performance. In some cases, the variation of the electrical characteristics of a data storage cell may be sufficiently large that the data storage cell may not function (e.g., read or write) under normal operating conditions of the memory circuit, resulting in the data storage cell being identified as a failure and requiring replacement with a redundant data storage cell. Adding redundant data storage cells to the memory circuit to compensate for data storage cells with non-ideal electrical characteristics may result in additional chip area and power consumptions. The embodiments illustrated below may provide techniques to identify and compensate for data storage cells with non-ideal electrical characteristics.

FIG. 1 illustrates a data storage cell according to one of several possible embodiments. In the illustrated embodiment, data storage cell 100 includes a true I/O 102 denoted as "bt," a complement I/O 103 denoted as "bc," and a selection input 101 denoted as "wl."

In the illustrated embodiment, bt 102 is coupled to selection transistor 104 and bc 101 is coupled to selection transistor 105. Selection transistor 104 and selection transistor 105 are controlled by wl 101. Selection transistor 104 is further coupled to pull-up transistor 108 and pull-down transistor 106 through node 110, and selection transistor 105 is further coupled to pull-up transistor 109 and pull-down transistor 107 through node 111. Pull-up transistor 108 and pull-down transistor 106 are controlled by node 111, and pull-up transistor 109 and pull-down transistor 107 are controlled by node 110.

It is noted that although selection transistors, pull-up transistors, pull-down transistors, and pre-charge transistors may be illustrated as individual transistors, in other embodiments, any of these transistors may be implemented using multiple transistors or other suitable circuits. That is, in various embodiments, a "transistor" may correspond to an individual transistor or other switching element of any suitable type (e.g., a field-effect transistor (FET)), or to a collection of transistors.

At the start of the storage operation true I/O 102 and complement I/O 103 may both be high and selection input 101 is low. It is noted that in this embodiment, low refers to a voltage at or near ground potential and high refers to a voltage sufficiently large to turn on n-channel metal oxide semiconductor field-effect transistors (MOSFETs) and turn off p-channel MOSFETs. In other embodiments, other circuit configurations may be used and the voltages that constitute low and high may be different. During the storage, or write, operation, selection input 101 may be switched high which couples true I/O 102 to node 110 and complement I/O 103 to node 111. To store a logical 1 into data storage cell 100, complement I/O 103 may be switched to a low. Since selection transistor 105 is on, node 111 is also switched low. The low on node 111 activates pull-up transistor 108 which charges node 110 high. The high on node 110, in turn, activates pull-down transistor 107, which further reinforces the low on node 111 establishing regenerative feedback. Once this regenerative feedback between nodes 110 and 111 has been established, selection input 101 may be switched low turning off selection transistor 104 and selection transistor 105, isolating node 110 from true I/O 102 and node 111 from complement I/O 103. The method of storing a logical 0 may be similar. Selection input 101 may be switched high and true I/O 102 may be switched low. Selection transistor 104 couples the low on true I/O 102 to node 110, which activates pull-up transistor 109. The high on node 111 activates pull-down transistor 106, reinforcing the low on node 110 and establishing the regenerative feedback. Data storage cells that store data via regenerative feedback are commonly referred to as static cells.

In the illustrated embodiment, data storage cell 100 outputs its stored data as the difference in voltage between true I/O 102 and complement I/O 103. (Data stored as the difference between two voltages may also be referred to herein as "differentially encoded".) At the start of the output process, true I/O 102 and complement I/O 103 may both be high and selection input 101 may be low. Asserting selection input 101 activates selection transistor 104 and selection transistor 105. If node 111 is low and node 110 is high, then a current will flow through selection transistor 105 and pull-down transistor 107 causing a reduction in voltage on complement I/O 103. If node 110 is low and node 111 is high, then a current will flow through selection transistor 104 and pull-down transistor 106 causing a reduction in voltage on true I/O 102. For either data state, the current that the data storage cell sinks from either the true I/O 102 or complement I/O 103 is referred to as the read current of the cell.

Ideally, the electrical characteristics of pull-down transistor 106 and pull-down transistor 107 would be identical, as would be the electrical characteristics of selection transistor 104 and selection transistor 105. Furthermore, in an ideal circuit, it might be desirable that pull-down transistor 106 and pull-down transistor 107 in one data storage cell in a memory device have identical electrical characteristics to pull-down transistor 106 and pull-down transistor 107 in another data storage cell in the memory device. However, during the semiconductor manufacturing process, differences in lithography, fluctuations in dopant levels, etc., may result in these transistors having different electrical characteristics (e.g., saturation current). Aging effects induced by, e.g., hot-carrier injection may also change a transistor's electrical characteristics over time. Variation, due to both manufacturing and aging effects, in pull-down transistor 106, pull-down transistor 107, selection transistor 104 and selection transistor 105 from one data storage cell to another may result in variation in read currents, and, therefore variation in output voltages for the same stored data.

In some cases, the variation in the electrical characteristics of the transistors may result in larger than average output voltages when the storage cell is read. Data storage cells that generate larger than average output voltages may be referred to as strong cells. In some cases, the variation in the electrical characteristic of the transistors may result in smaller than average output voltages when the storage cell is read. Data storage cells that generate smaller than average output voltages may be referred to as weak cells. If the value of the output voltage generated by a weak storage cell is sufficiently small, it may not be possible to properly determine the data stored in the data storage cell, because the output voltage may not be able to overcome imbalances and signal noise within a sense amplifier.

It is noted that the number of transistors and the connectivity shown in FIG. 1 are merely an illustrative example, and that in other embodiments, other numbers, types of transistors, and/or circuit configurations may be employed. It is also noted that in other data storage cell embodiments, other storage mechanisms may be employed. For example, a capacitor (as, e.g., in a dynamic random access memory (DRAM)), transistor implants (as, e.g., in a depletion programmable read-only memory (ROM)), or a floating gate structure (as in a single-bit or multi-bit non-volatile or flash memory) may be used to store data in a data storage cell.

Figure 2:
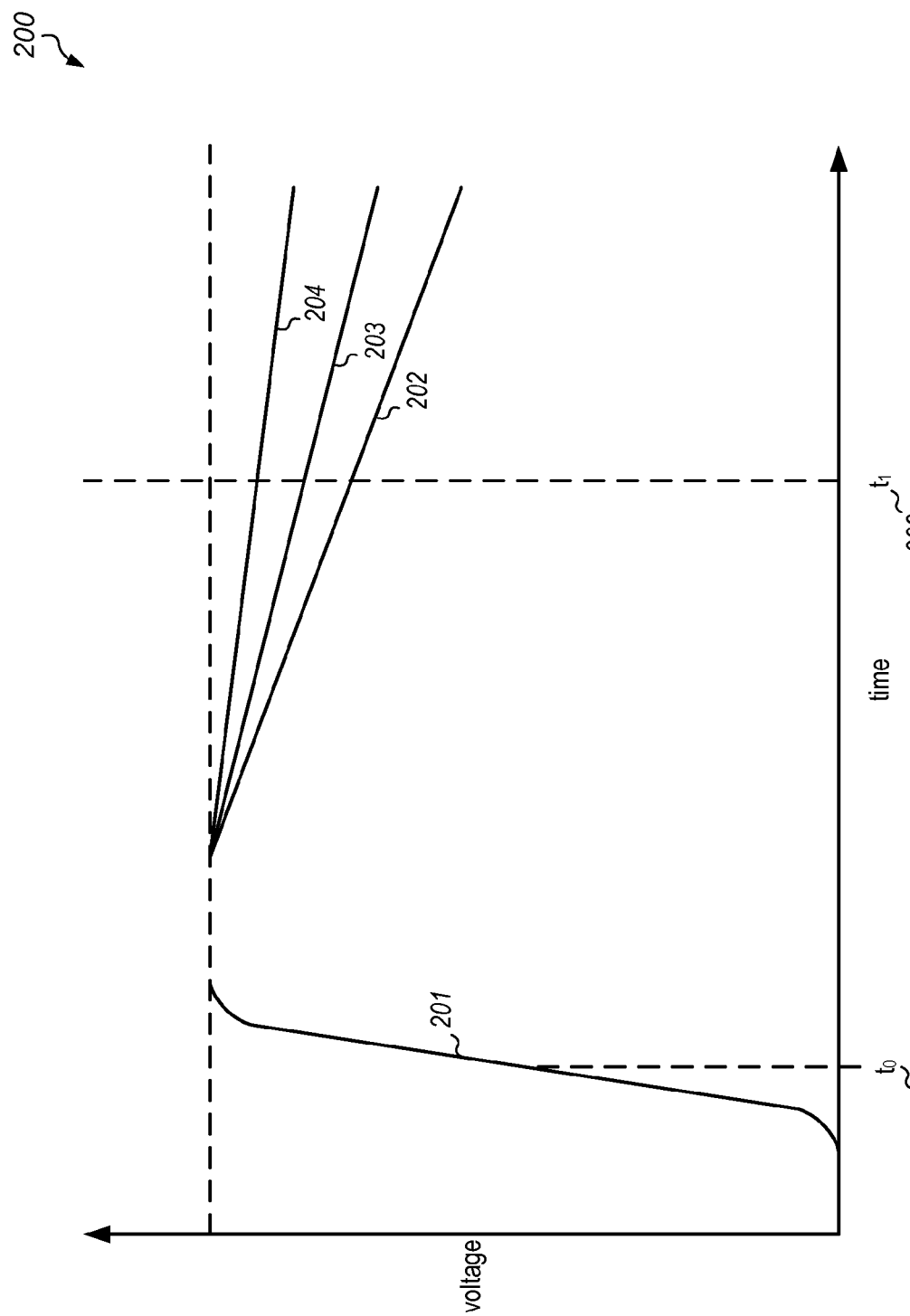
FIG. 2 illustrates possible waveforms for the discharge of bit lines.

FIG. 2 illustrates possible waveforms resulting from the operation of the embodiment of the data storage cell shown in FIG. 1. At time $t_0$ 205, the selection input 101 is asserted (waveform 201). Depending on the value of the stored data, either true I/O 102 or complement I/O 103 will begin to discharge (waveform 203). At time $t_1$ 206, the small signal differential between true I/O 102 and complement I/O 103 is amplified by a sense amplifier. The system including one or more data storage cells may be modeled as a capacitor and current source. The capacitor represents the total capacitance present on either true I/O 102 or complement I/O 103 which may include the junction capacitance of other data storage cells I/O ports and the capacitance of the interconnect between the data storage cells. The current source is the read current of the data storage cell. With this model, the voltage on the low-going I/O from time $t_0$ to time $t_1$ can be estimated using equation 1.

$$v(t) = \frac{1}{C} \int_{t_0}^{t_1} i(t) \, dt \qquad (1)$$

Over a limited range of time and voltages, the read current can be treated as a constant. This allows the equation to be simplified as shown in equation 2. For a constant load capacitance, the voltage change on the low-going I/O is proportional to the read current of the data storage cell. If the read current of the data storage cell is less than average, then the change in voltage on the low-going I/O will be less (waveform 204), resulting in a smaller differential voltage at the time the sense amplifier is activated. If the read current of the data storage cell is larger than average, then the change in voltage on the low-going I/O will be greater (waveform 202), resulting in a larger differential at the time the sense amplifier is activated. It is noted that the waveforms shown in FIG. 2 are merely an illustrative example and that, in other embodiments, differing waveform behavior may be possible.

$$\Delta v = \frac{i_{read}}{C}(t_1 - t_0) \qquad (2)$$

Figure 3:
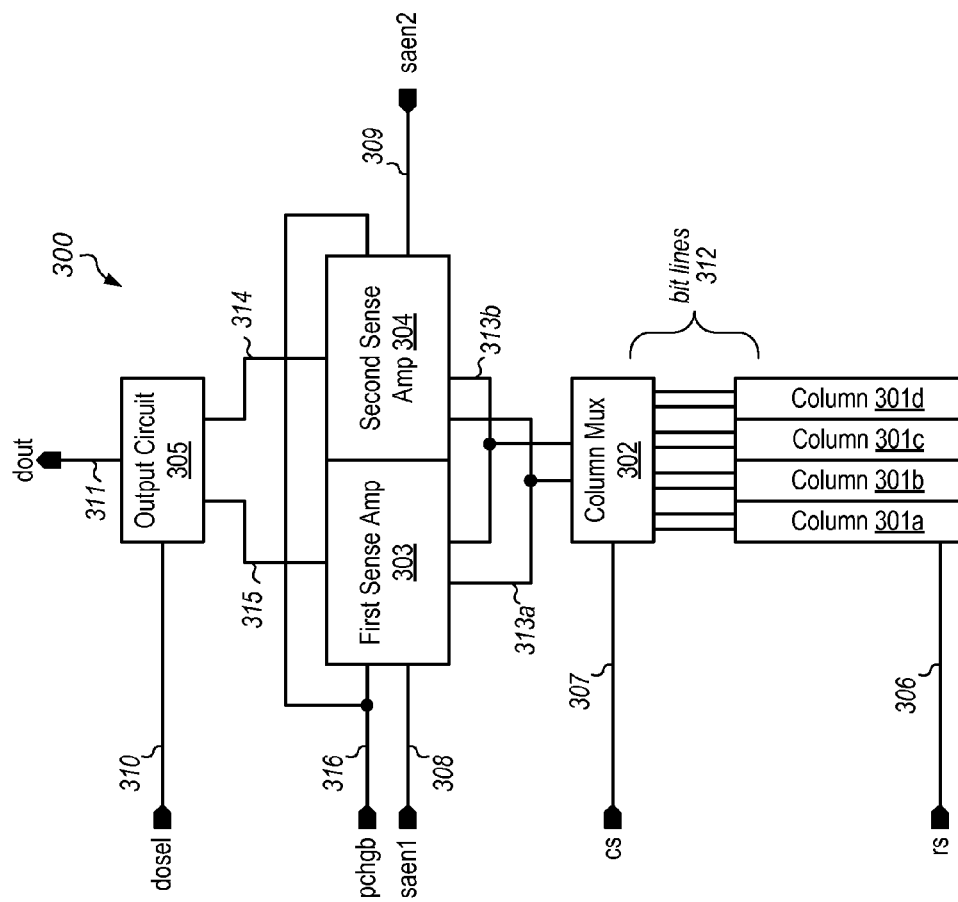
FIG. 3 illustrates an embodiment of a memory sub-array.

FIG. 3 illustrates an embodiment of a memory sub-array which includes a data output 311 denoted as "dout," a precharge control input 316 denoted as "pchgb," a first sense amplifier enable input 308 denoted as "saen1," a second sense amplifier enable input 309 denoted as "saen2." The illustrated embodiment also includes one or more column selection inputs 307 denoted as "cs" and one or more row selection inputs 306 denoted as "rs".

In the illustrated embodiment, columns 301a, 301b, 301c, and 301d are coupled to the inputs of column multiplexer 302 through bit lines 312. The differentially encoded output of column multiplexer 302 is coupled to the differential inputs of first sense amplifier 303 and second sense amplifier 304 through nodes 313a and 313b. The output of first sense amplifier 303 and the output of second sense amplifier 304 are coupled to the input of output circuit 305, and the output of output circuit 305 is coupled to dout 311.

Each column 301 may include one or more of data storage cell 100. For example, the individual bit lines bt 102 of each data storage cell 100 within in a column 301 may be coupled together to form a true bit line 312 of column 301. Likewise, the individual bit lines bc 103 of each data storage cell 100 within column 301 may be coupled together to form a complement bit line 312 of column 301. Individual word lines wl 101 of each data storage cell 100 within column 301 may coupled to a respective one of row select signals rs 306 such that when a given rs 306 is asserted, the corresponding data storage cell 100 creates a differentially encoded output on the true bit line and complement bit line of column 301, while the bit line outputs of the remaining data storage cells 100 within column 301 remain quiescent. In other embodiments, the data storage cells may be dynamic storage cells, single-bit or multi-bit non-volatile storage cells, or mask programmable read-only storage cells. It is noted that in some embodiments, the data storage cell may transmit data in a single-ended fashion. In such cases, only a single bit line per column is required.

In some embodiments, column multiplexer 302 may contain one or more pass gates controllable by cs 307. The input of each pass gate may be coupled to the either the true or complement bit line output from one of columns 301a, 301b, 301c, and 301d. The output of each pass gate coupled to a true bit line is coupled to the true output of column multiplexer 302 in a wired-OR fashion, and the output of each pass gate coupled to a complement bit line is coupled to the complement output of column multiplexer 302 in a wired-OR fashion. In other embodiments, column multiplexer 302 may contain one or more logic gates configured to perform the multiplexer selection function.

First sense amplifier 303 and second sense amplifier 304 may use analog amplification techniques in some embodiments. In other embodiments, first sense amplifier 303 and second sense amplifier 304 may employ a latch based amplification technique. The gain level of first sense amplifier 303 and the gain level of second sense amplifier 304 may be the same in some embodiments and different in other embodiments.

Figure 4:
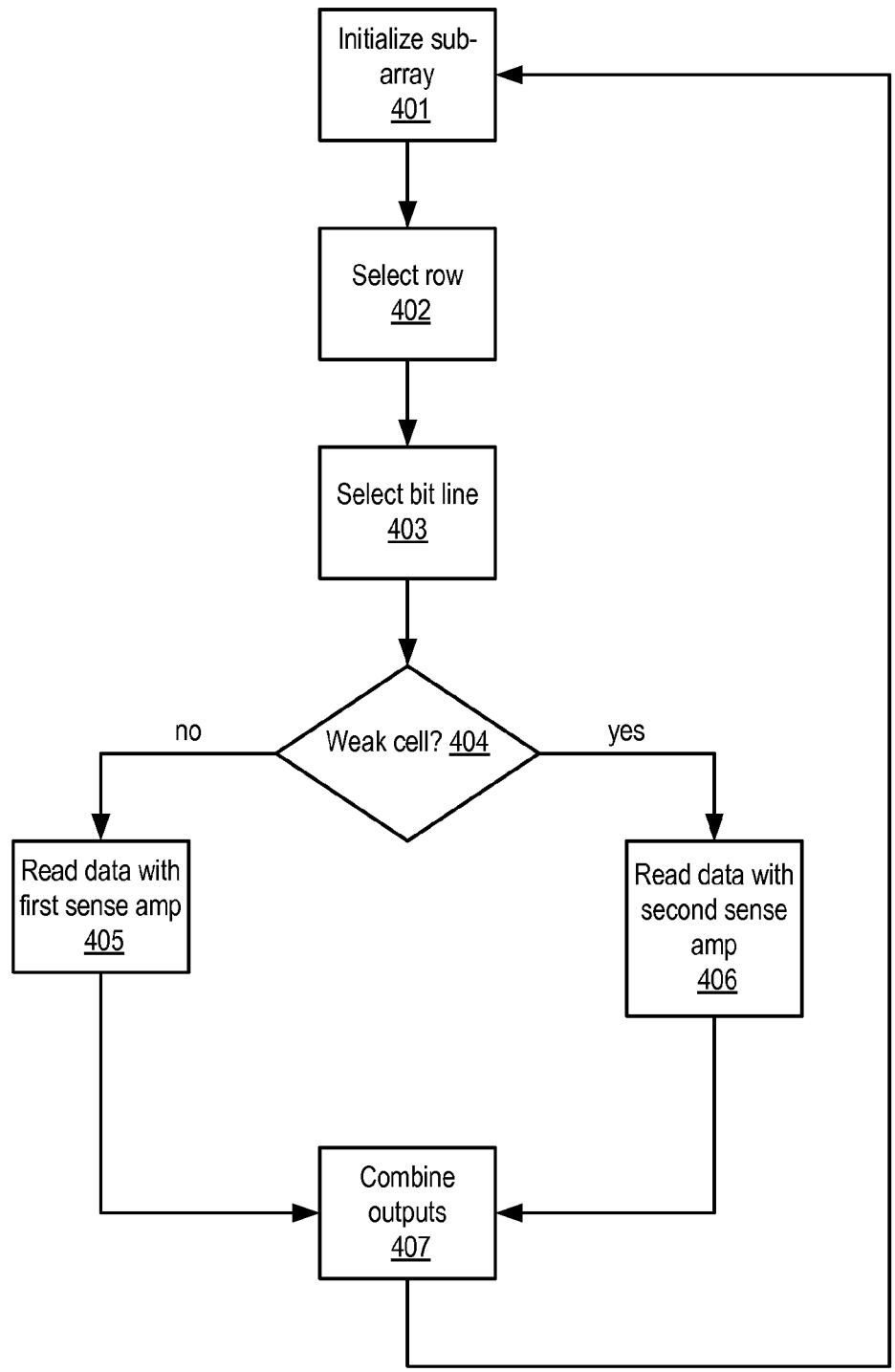
FIG. 4 illustrates a possible method of operation of the embodiment shown in FIG. 3.

In some embodiments, the illustrated sub-array 300 may operate as follows. Referring collectively to FIG. 3 and the flowchart illustrated in FIG. 4, the operation starts by initializing the sub-array (block 401) by setting pchgb 316 low and setting rs 306, cs 307, saen1 308, and saen2 309 to inactive states. Once sub-array 300 has been initialized, one of rs 306 may be asserted (block 402) selecting a data storage cell in each of columns 301a, 301b, 301c, and 301d. One of cs 307 may then be asserted (block 403), causing column multiplexer 302 to output data selected from one of bit lines 312.

The operation then depends on strength of the selected data storage cell (block 404). When the selected data storage cell has normal strength, saen1 308 may be set high, causing first sense amplifier 303 to amplify the data on nodes 313a and 313b, and output the result on node 315 (block 405). Dosel 310 may then be asserted such that output circuit 305 couples node 315 to output 311. Sub-array 300 may then be re-initialized by de-asserting saen1 308, and the asserted one of rs 306 and cs 307, and setting pchgb 316 low (block 401).

When the selected data storage cell is weak, saen2 309 may be set high causing second sense amplifier 304 to amplify the data on nodes 313a and 313b, and output the result on node 314 (block 406). Dosel 310 may then be asserted such that output circuit 305 couples node 314 to dout 311. Sub-array 300 may then be re-initialized by de-asserting saen2 309, and the asserted one of rs 306 and cs 307, and setting pchgb 316 low (block 401).

Figure 5:
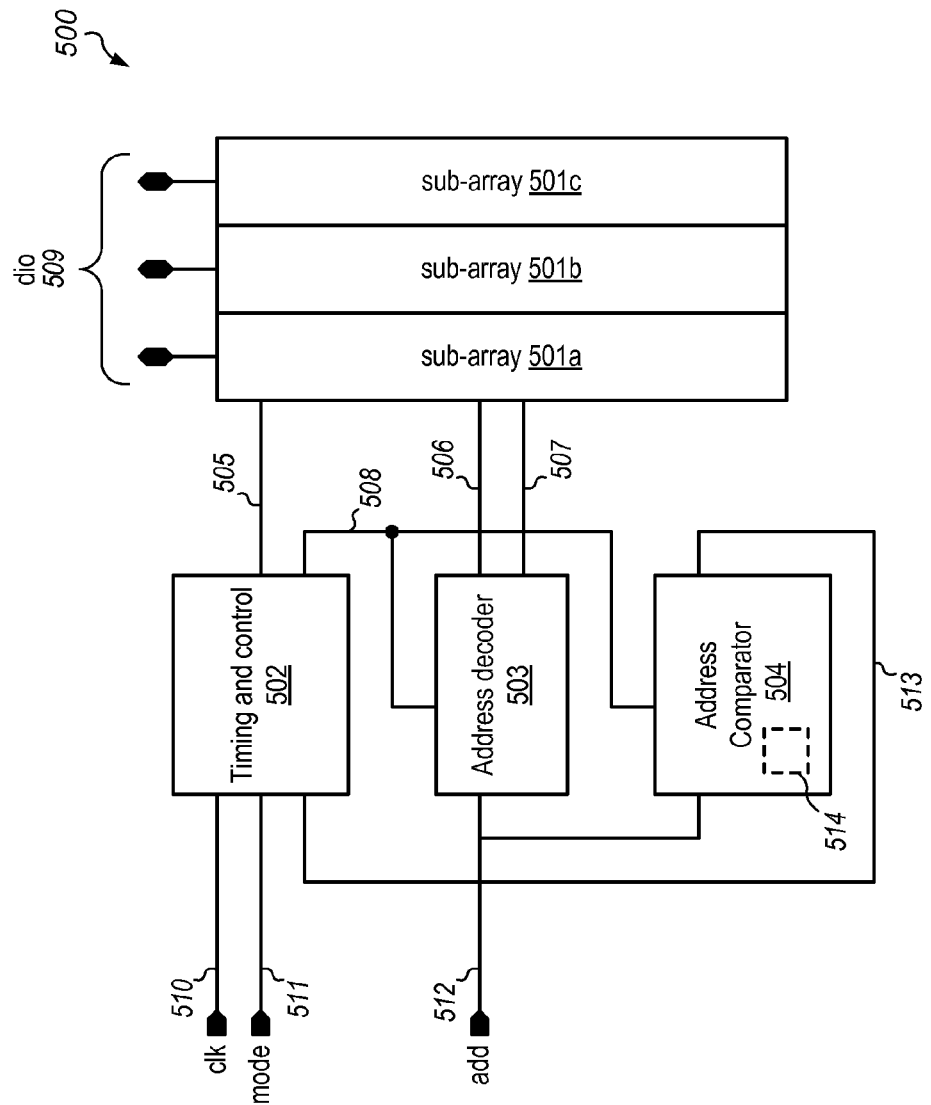
FIG. 5 illustrates an embodiment of a memory.

FIG. 5 illustrates a memory according to one of several possible embodiments. In the illustrated embodiment, memory 500 includes data I/O ports 509 denoted "dio," an address bus input 512 denoted "add," mode selection inputs 511 denoted "mode," and a clock input 510 denoted "clk."

In the illustrated embodiment, memory 500 includes sub-arrays 501a, 501b, and 501c, timing and control unit 502, address decoder 503, and address comparator 504. Sub-arrays 501a, 501b, and 501c may incorporate some or all of the features described above with respect to sub-arrays 300. Timing and control unit 502 is coupled to provide a decoder enable signal 508 to address decoder 503 and address comparator 504, and control signals 505 to sub-arrays 501a, 501b, and 501c. In some embodiments, control signals 505 may include a pre-charge signal, a first sense amplifier enable signal, a second sense amplifier enable, and a data output selection signal that may operate as described above with respect to sub-array 300.

Address decoder 503 is coupled to provide row selects 506 and column selects 507 to sub-arrays 501a, 501b, and 501c, in response to the assertion of decoder enable signal 508 and the address value on address bus 512. Address comparator 504 is coupled to provide misread indication signal 513 to timing and control unit 502 based upon a comparison of the address value on add 512 to a collection of address values previously determined to select weak data storage cells in sub-arrays 501a, 501b, and 501c. In some embodiments, address comparator 504 may include a storage unit 514 configured to store address values that select weak data storage cells.

Figure 6:
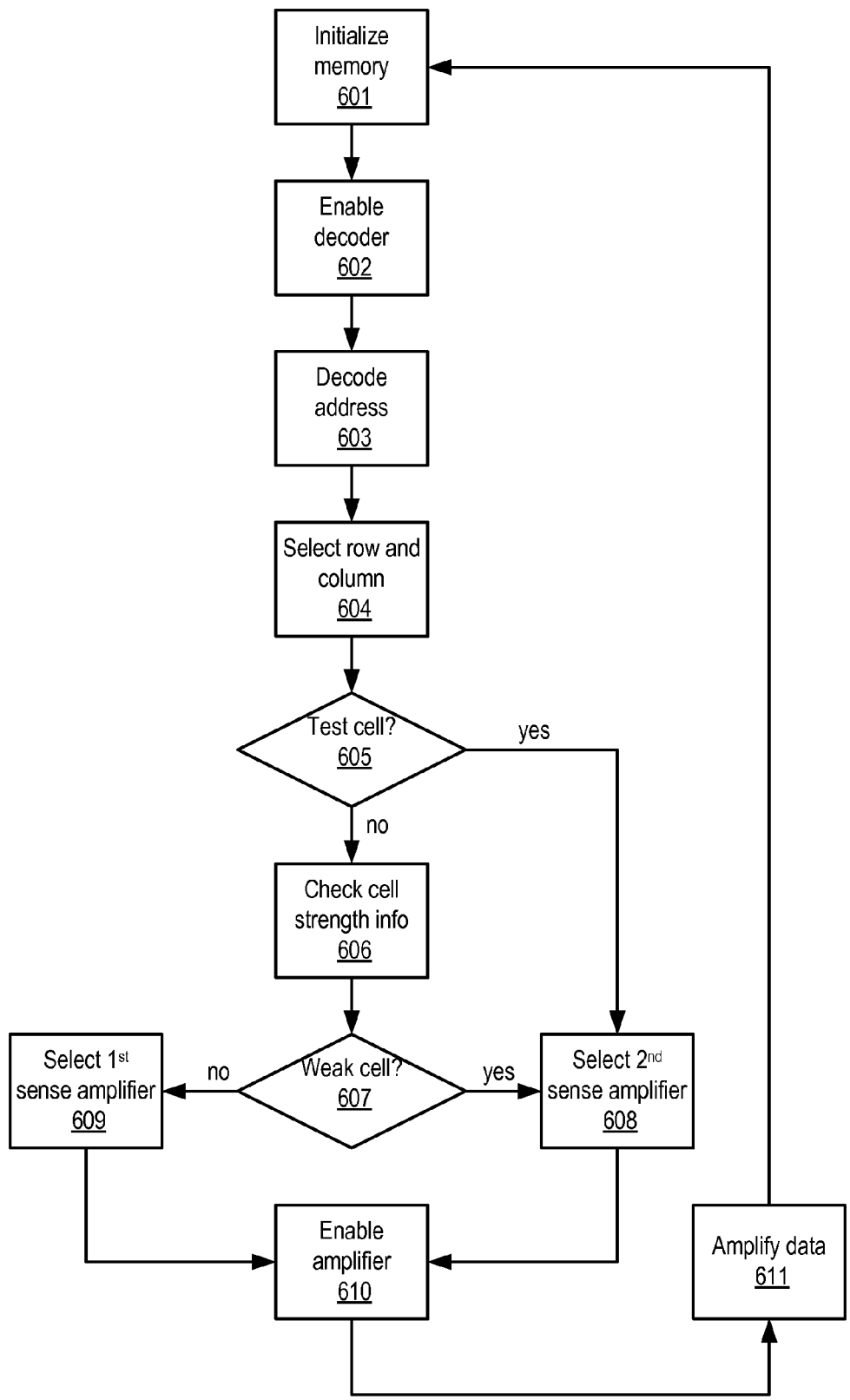
FIG. 6 illustrates a possible method of operation of the embodiment shown in FIG. 5.

A possible method of operation memory 500 is illustrated in FIG. 6. Referring collectively to FIG. 5 and the flowchart illustrated in FIG. 6, the operation begins by de-asserting clk 510 to initialized memory 500 (block 601). Clk 510 may then be asserted, causing timing and control block 502 to assert decoder enable 508 (block 602). Address decoder 503 may then decode the address presented on add 512 in response to the assertion of decoder enable 508 (block 603), causing one of row selects 506 and one of column selects 507 to be asserted (block 604). The operation then depends on if memory 500 is in test mode (block 605). When mode 511 indicates memory 500 is in test mode, timing and control unit 502 may then assert the appropriate signal in control signals 505 to select (block 608) and activate (block 61) second sense amplifiers in sub-arrays 501a, 501b, and 501c. The second sense amplifiers may then output the amplified data to dio 509 (block 611), at which point memory 500 may be re-initialized by de-asserting clk 510 (block 601).

When mode 511 indicates memory 500 is not in test mode, address comparator 504 compares the address presented on add 512 against a list of addresses previously determined to select weak data storage cells. In some embodiments, the list of addresses may be contained in storage array 514. The operation then depends on the strength of the data storage cells selected in sub-arrays 501a, 501b, and 501c (block 607). When the data storage cells selected in sub-arrays 501a, 501b, and 501c, are of normal strength, timing and control unit 502 may assert the appropriate control signal in control signals 505 to select (block 609) and enable (block 610) first sense amplifiers in sub-arrays 501a, 501b, and 501c. The first sense amplifiers may then output the amplified data to dio 509 (block 611). Memory 500 may then be re-initialized by de-asserting clk 510 (block 601).

When the data storage cells selected in sub-arrays 501a, 501b, and 501c contain one or more weak data storage cells, address comparator 504 may assert misread indication signal 513. Timing and control unit 502 may then assert the appropriate control signal in control signals 505 to select (block 608) and enable (block 610) second sense amplifiers in sub-arrays 501a, 501b, and 501c, in response to the assertion of misread indication signal 513. The second sense amplifiers may then output the amplified data to dio 509 (block 611), at which point memory 500 may be re-initialized by de-asserting clk 510 (block 601). It is noted that some or all of the operations illustrated in FIG. 6 may occur in a different order, or may occur concurrently rather than sequentially.

Figure 7:
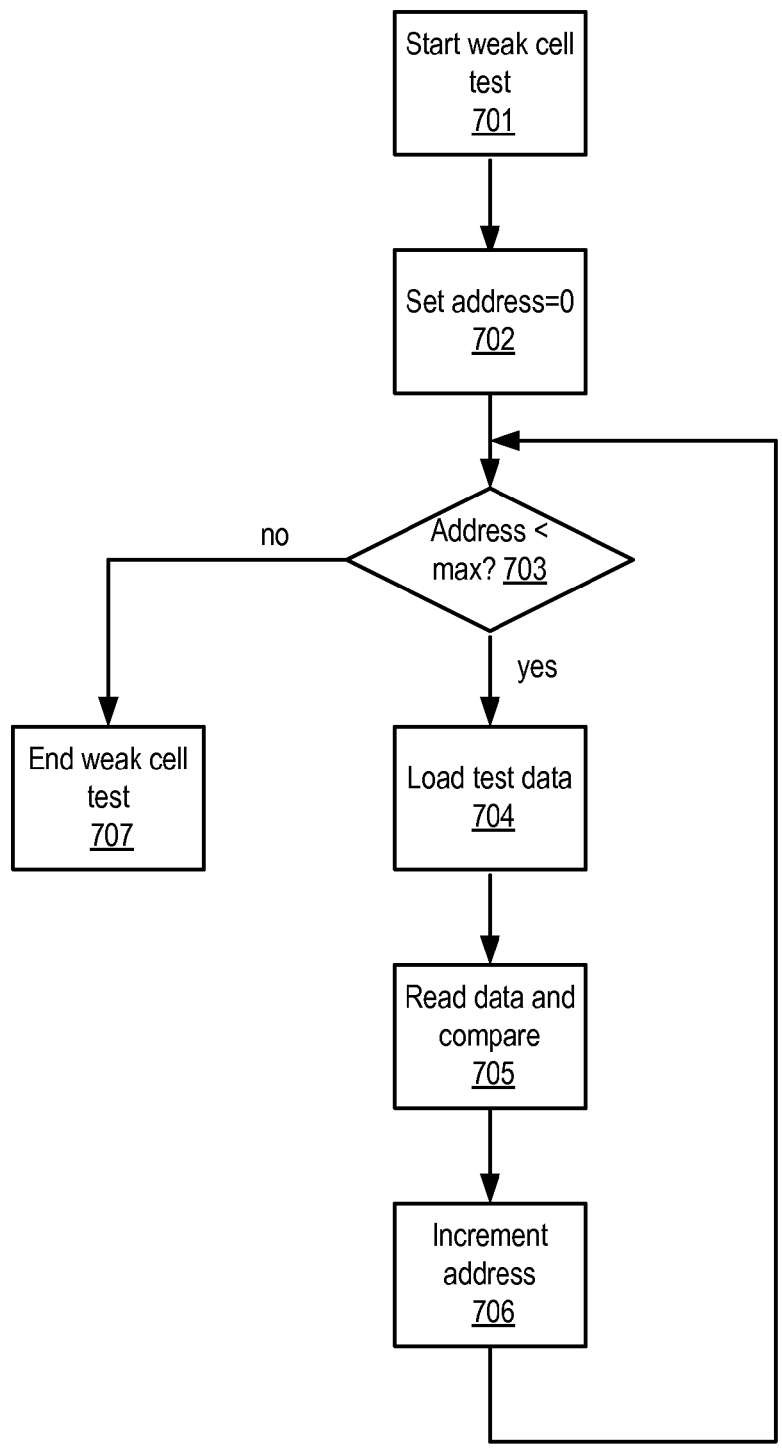
FIG. 7 illustrates a possible method of testing a memory for weak bits.

FIG. 7. Illustrates a possible method of operating memory 500 to test for weak data storage cells. Referring collectively to FIG. 5 and the flowchart illustrated in FIG. 7, the operation starts in block 701. The value presented to add 512 is set to zero (block 702). The operation then depends on the value presented to add 512 (block 703). When the value presented to add 512 exceeds the maximum address of memory 500, the test ends (block 707). When the value presented to add 512 is less than the maximum address of memory 500, mode 511 may be set for a write operation, test data may be presented to dio 509, and clk 510 may be asserted, writing the test data into the data storage cells selected by the value presented to add 512 (block 704).

Once the test data has been loaded, memory 500 is re-initialized. Mode 511 may be set for read and test operation and clk 510 is asserted initiating the read and comparison operation as will be described in reference to FIG. 8 (block 705). When the read and comparison operation has completed, memory 500 may be re-initialized and the value presented to add 512 may be incremented (block 706) and the value checked against the maximum address for memory 500 (block 703). It is noted that operations shown in FIG. 7 are merely an illustrative example and that in actual circuit operation, other operations and order of operations may be possible.

Figure 8:
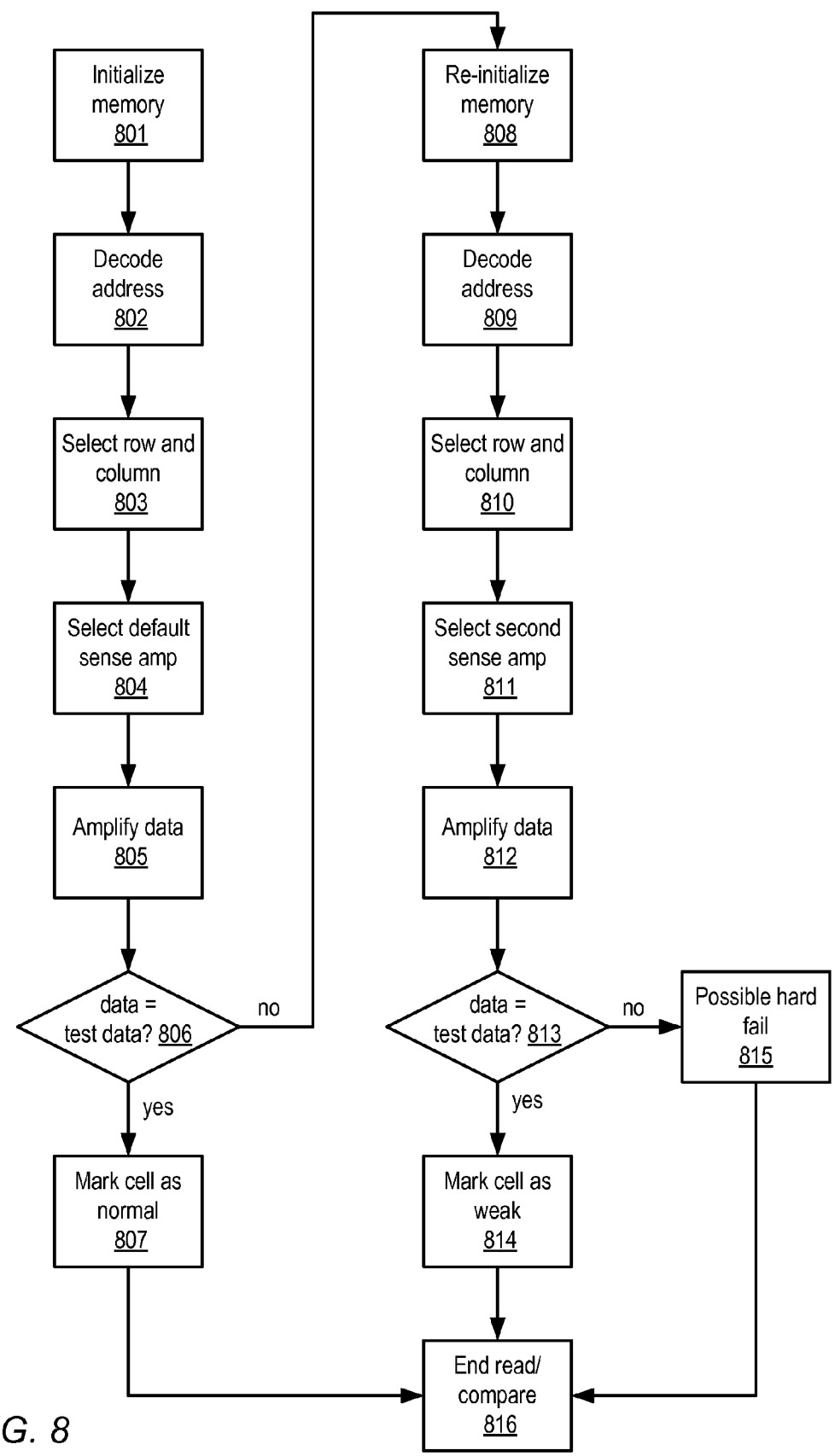
FIG. 8 illustrates a possible method for reading a memory and comparing stored data to previously loaded test data.

A possible method of operating memory 500 to read and compare previously loaded test data is illustrated in FIG. 8. Referring collectively to FIG. 5 and the flow chart illustrated in FIG. 8, the operation may begin by de-asserting clk 510 to initialize memory 500 (block 801). Mode 511 may be set for normal read operation and clk 510 may be asserted which causes timing and control unit 502 to assert decoder enable signal 508. Address decoder 503 decodes the address presented to add 512 (block 802) in response to the assertion of decoder enable signal 508, and asserts one of row selects 506 and one of column selects 507 (block 803) selecting a data storage cell in each of sub-arrays 501a, 501b, and 501c. Timing and control unit 502 may then assert the appropriate signal in control signals 505 to activate first sense amplifiers (block 804) in sub-arrays 501a, 501b, and 501c, causing the first sense amplifiers to amplify the data from the selected data storage cells and output the amplified data to dio 509 (block 805).

The operation then depends on value of data output on dio 509 (block 806). When the data output on dio 509 matches the originally loaded test data, the selected data storage cells may be identified as normal (block 807). In this test flow, no further action is taken and the test of data storage cells at the given address is complete (block 816). When the data output on dio 509 does not match the originally loaded test data, further testing may be necessary and clk 510 may be de-asserted, re-initializing memory 500 (block 808). Mode 511 may be set for test read operation and clk 510 may be asserted. In response to the assertion of clk 510, timing and control unit 602 asserts decoders enable 508, causing decoder 503 to decode the address presented to add 512 (block 809). Address decoder 503 may then assert one of row selects 506 and one of column selects 507, selecting a data storage cell in each of the sub-arrays 501a, 501b, and 501c (block 810). In some embodiments, timing and control unit 502 may then assert the necessary control signals 505 to activate second sense amplifiers in sub-arrays 501a, 501b, and 501c (block 811), causing the second sense amplifiers to amplify the data from the selected data storage cells and output the amplified data to dio 509 (block 812).

The newly-read value of the data output on dio 509 may be compared against the originally loaded test data (block 913). When the data output on dio 509 matches the originally loaded test data, one or more of the selected data storage cells may be weak. The address that selected these data storage cells may be noted as containing weak cells (block 814). The test operation at the given address may be complete (block 816). When the data output on dio 509 does not match the originally loaded test data, one or more of the selected data cells may contain a hard failure. The address that selected these data storage cells may be noted as containing a hard failure (block 815). The test operation at the given address may then be complete (block 816). In some embodiments, the address that selected weak data storage cells may be loaded into storage unit 514 such that when the stored address is encountered in subsequent read access to memory 500, address comparator 504 asserts misread indication signal 513. It is noted that during actual circuit operation, some or all of the operations illustrated in FIG. 8 may occur in a different order, or may occur concurrently rather than sequentially.

Figure 9:
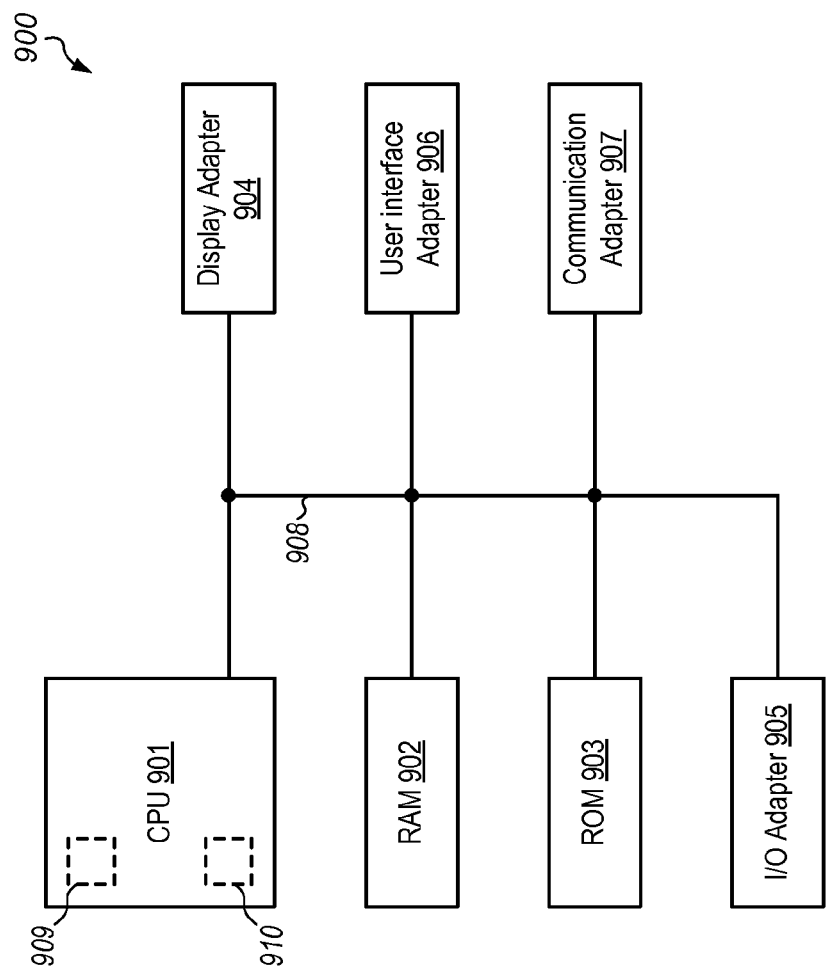
FIG. 9 illustrates an embodiment of a computing system.

Turning now to FIG. 9, a block diagram of a system is illustrated. In the illustrated embodiment, the system 900 includes an instance of a random access memory (RAM) 902 and a read-only memory (ROM) 903 each of which each may include one or more sub-arrays that may incorporate some or all of the features described above with respect to sub-array 300.

The illustrated embodiment also includes a CPU 901 which may include one or more local storage units 909. For example, CPU 901 may include a Cache Data RAM, a Tag RAM, one or more register files, and one or more FIFOs. Each one of the local storage units 909 may include one or more sub-arrays that may incorporate some or all of the features described above with respect to sub-array 300. In some embodiments, CPU 901 may include a test unit 910 configured to operate the sub-arrays. In other embodiments, test unit 910 may be further configured to store addresses that select weak data storage cells. Additionally, the illustrated embodiment includes an I/O adapter 905, a display adapter 904, a user interface adapter 906, and a communication adapter 907.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a plurality of columns;
      wherein each of the columns includes a plurality of data storage cells, wherein each given one of the data storage cells is configured such that in response to the assertion of a row selection signal, the given data storage cell generates a column output; and
   a column multiplexer coupled to receive input data from the plurality of columns wherein the column multiplexer is configured to controllably select data from one of the plurality of columns to generate a column multiplexer output dependent upon a column selection signal; and
   a first sense amplifier with a first gain level configured to amplify the column multiplexer output signal by the first gain level and generate a first sense amplifier output signal in response to the assertion of a first control signal; and
   a second sense amplifier with a second gain level, where the second gain level is higher than the first gain level, configured to amplify the column multiplexer output signal by the second gain level and generate a second sense amplifier output signal in response to the assertion of a second control signal; and
   an output circuit configured to receive the first sense amplifier output signal and the second sense amplifier output signal, and logically combine them based upon a output selection signal.

2. The apparatus of claim 1, wherein the output circuit includes a multiplexer configured to controllably select the first sense amplifier output signal or the second sense amplifier output signal dependent upon the output selection signal.

3. The apparatus of claim 1, wherein the first sense amplifier is further configured to generate a high impedance output dependent upon a first state of the output selection signal, and wherein the second sense amplifier is further configured to generate a high impedance dependent upon a second state of the output selection signal.

4. The apparatus of claim 3, wherein the output circuit includes a node that couples the output of the first sense amplifier to the output of the second sense amplifier.

5. A method, comprising:
   detecting cell strength for a data storage cell; and
   amplifying data from the data storage cell using a first sense amplifier with a first gain level or a second sense amplifier with a second gain level dependent upon the detected cell strength.

6. The method of claim 5, further comprising:
   storing cell strength information indicative of the detected cell strength; and
   checking the stored cell strength information.

7. The method of claim 5, further comprising:
   wherein the second gain level is higher than the first gain level; and
   amplifying data stored in the data storage cell using the second sense amplifier in response to the detected cell strength being indicative of a weak data storage cell.

8. The method of claim 6, further comprising:
   asserting a miss-read indication signal in response to the detected cell strength being indicative of a weak data storage cell.

9. An apparatus, comprising:
   a plurality of data storage cells; and
   a plurality of read circuits;
   wherein each of the read circuits comprises:
      a first sense amplifier with a first gain level configured to receive input data from a selected one of the plurality of data storage cells; and
      a second sense amplifier with a second gain level, where the second gain level is greater than the first gain level, configured to receive input data from a selected one of the plurality of data storage cells; and
      an output circuit configured to receive the outputs of the first sense amplifier and the output of the second sense amplifier, and logically combine them.

10. The apparatus of claim 9, wherein the second gain level is higher than the first gain level.

11. The apparatus of claim 9, wherein the first sense amplifier and the second sense amplifier are enabled simultaneously.

12. The apparatus of claim 9, wherein the first sense amplifier is enabled when a first data storage cell is selected and the second sense amplifier is enabled when a second data storage cell is selected.

13. A memory circuit, comprising:
   a plurality of sub-arrays;
      wherein each of the sub-arrays comprises:
         a plurality of columns;
            wherein each of the columns comprises:
               a plurality of data storage cells, wherein each given one of the data storage cells is configured such that, in response to the assertion of a respective one of a plurality of row selection signals, the given data storage cell generates a column output; and
            a column multiplexer configured to receive the column output signal from each one of the plurality of columns, wherein the column multiplexer is configured to controllably select the column output signal from one of the plurality of columns in response to the assertion of a respective one of a plurality of column selection signals; and a first sense amplifier with a first gain level configured to amplify, by the first gain level, the column output signal from the selected one of the plurality of columns in response to the assertion of a first amplifier enable signal; and a second sense amplifier with a second gain level configured to amplify, by the second gain level, the column output signal from the selected one of the plurality of columns in response to the assertion of a second amplifier enable signal; and an output circuit configured to receive the output of the first sense amplifier and the output of the second sense amplifier and logically combine them; and a timing and control unit configured to generate a first amplifier enable signal, a second amplifier enable signal, and a data output selection signal; and an address decoder configured to receive an input address such that, in response to the value of the input address, the address decoder asserts one of a plurality of row select signals and one of a plurality of column select signals.

14. The memory of claim 13, wherein the address decoder includes a storage array and a comparator configured to compare the input address to the contents of the storage array.

15. The memory of claim 14, wherein the address decoder is further configured to generate a misread indication signal when the comparator detects a match between the input address and the contents of the storage array.

16. The memory of claim 15, wherein the timing and control unit is further configured to generate the first amplifier enable signal, the second amplifier enable signal, and the data output selection signal dependent upon the misread indication signal.

17. A system, comprising:
a processing unit,
one or more memories,
wherein the processing unit comprises:
   one or more storage arrays;
   wherein each of the storage arrays comprises:
      a plurality of data storage cells; and
      a plurality of read circuits;
      wherein each of the read circuits comprises:
         a first sense amplifier with a first gain level configured to amplify, by the first gain level, input data from a selected one of the plurality of data storage cells in response to the assertion of a first amplifier enable signal; and
         a second sense amplifier with a second gain level configured to amplify, by the second gain level, input data from the selected one of the plurality of data storage cells in response to the assertion of a second amplifier enable signal; and
         an output circuit configured to receive the output of the first sense amplifier and the output of the second sense amplifier and logically combine them.

18. The system of claim 17, wherein the output circuit controllably selects the output of the first sense amplifier or the output of the second sense amplifier dependent upon an output data selection signal.

19. The system of claim 18, wherein the processing unit includes a test unit configured to provide the first amplifier enable signal, the second amplifier enable signal, and the output data selection signal during test mode.

20. The system of claim 19, wherein the test unit is further configured to store address information indicative of addresses that selected weak data storage cells in the storage arrays.

* * * * *